(12) United States Patent
Sakai et al.

(10) Patent No.: US 6,672,161 B2
(45) Date of Patent: Jan. 6, 2004

(54) SEMICONDUCTOR DYNAMIC QUANTITY SENSOR

(75) Inventors: Minekazu Sakai, Kariya (JP); Yoshiyuki Kato, Nakatsugawa (JP)

(73) Assignee: Denso Corporation, Kariya (JP)

( * ) Notice: Subject to any disclaimer, the term of this patent is extended or adjusted under 35 U.S.C. 154(b) by 261 days.

(21) Appl. No.: 09/901,133

(22) Filed: Jul. 10, 2001

(65) Prior Publication Data

US 2002/0035873 A1 Mar. 28, 2002

(30) Foreign Application Priority Data

Jul. 21, 2000 (JP) ........................................ 2000-220913

(51) Int. Cl.[7] ........................................... G01P 15/125
(52) U.S. Cl. .................................................... 73/514.32
(58) Field of Search ..................... 73/514.29, 514.32, 73/514.38; 361/280, 283.3

(56) References Cited

U.S. PATENT DOCUMENTS 4,711,128 A * 12/1987 Boura
5,631,422 A * 5/1997 Sulzberger et al. ......... 73/514.32
5,894,090 A * 4/1999 Tang et al. ............... 71/514.32
6,151,966 A   11/2000 Sakai et al.

FOREIGN PATENT DOCUMENTS

| JP | A-9-79856 | 3/1997 |
| JP | A-2000-81335 | 3/2000 |

OTHER PUBLICATIONS

S/N 09/247,865; filed Feb. 11, 1999; Inventor Kato et al.

* cited by examiner

*Primary Examiner*—Robert Raevis
(74) *Attorney, Agent, or Firm*—Posz & Bethards, PLC

(57) ABSTRACT

In a dynamic quantity sensor for detecting a dynamic quantity, a movable portion having comb-shaped movable electrodes is connected to a base portion through a beam portion as a spring portion, and moves in direction Y upon receiving dynamic quantity. Comb-shaped fixed electrodes are arranged opposite to the movable electrodes through detection intervals. A Q value of vibration of the movable portion in the direction Y is smaller than 1/500 of a resonance frequency of the movable portion in the direction Y. Therefore, free vibration of the movable portion is rapidly damped so as not to adversely affect sensor output.

8 Claims, 4 Drawing Sheets

SEMICONDUCTOR DYNAMIC QUANTITY SENSOR

CROSS REFERENCE TO RELATED APPLICATION

This application is based upon and claims the benefit of Japanese Patent Application No. 2000-220913 filed on Jul. 21, 2000, the content of which is incorporated herein by reference.

BACKGROUND OF THE INVENTION

1. Field of the Invention

This invention relates to a dynamic quantity sensor including a movable portion, a movable electrode integrated with the movable portion and a fixed electrode arranged opposite to the movable electrode for detecting a dynamic quantity based on a change of an interval between the movable electrode and the fixed electrode.

2. Description of the Related Art

JP-A-11-326365 discloses a capacitance-type semiconductor dynamic quantity sensor. In this dynamic quantity sensor, a movable portion is connected to a base portion through a spring portion so as to move in a predetermined direction. Further, movable electrodes are integrated with the movable portion, and fixed electrodes are arranged opposite to the movable electrodes. When a dynamic quantity is applied to the sensor, the sensor detects the applied dynamic quantity by detecting changes of intervals between the movable electrodes and the fixed electrodes as capacitance changes.

In the conventional dynamic quantity sensor, however, since the movable portion is connected to the base portion through the spring portion, when a large shock is applied to the sensor, the movable portion performs free vibration (oscillation) for awhile even after the shock disappears. If the free-vibration time becomes longer in this manner, the intervals between the movable electrodes and the fixed electrodes fluctuate due to the free-vibration. Therefore, even after the large-shock application is ended, signals would be output from the sensor as if the shock were still applied to the sensor, thereby degrading the sensitivity of the sensor output.

SUMMARY OF THE INVENTION

The present invention has been made in view of the above problem. An object of the present invention is to shorten a free-vibration time of a movable portion so as not to adversely affect sensor output when a large shock is applied to a sensor.

According to the present invention, a dynamic quantity sensor includes a base portion, a spring portion connected to the base portion, a movable portion connected to the spring portion, a movable electrode integrated with the movable portion, and a fixed electrode supported by the base portion. The spring portion moves in a predetermined direction in accordance with a dynamic quantity applied thereto, and the movable portion and the movable electrode move together with the spring portion in the predetermined direction. In this sensor, a Q value of vibration of the movable portion in the predetermined direction is smaller than $\frac{1}{500}$ of a resonance frequency of the vibration of the movable portion in the predetermined direction.

Accordingly, when a large shock is actually applied to the dynamic quantity sensor, free-vibration time of the movable portion can be made shorter so as not to affect sensor output. Here, the Q value represents a resonance sharpness, and is indicated by $\pi/\delta$ where $\delta$ is a logarithm damping degree of damping vibration.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENT

The present invention is described with reference to an embodiment and modifications described below. A dynamic quantity sensor according to the present invention is applied to a differential capacitance type semiconductor acceleration sensor which can be applied to a vehicle acceleration sensor, a gyro sensor and the like for controlling operations of an air bag system, an ABS (antilock braking system), a VSC (vehicle safety control) and the like.

Figure 1:
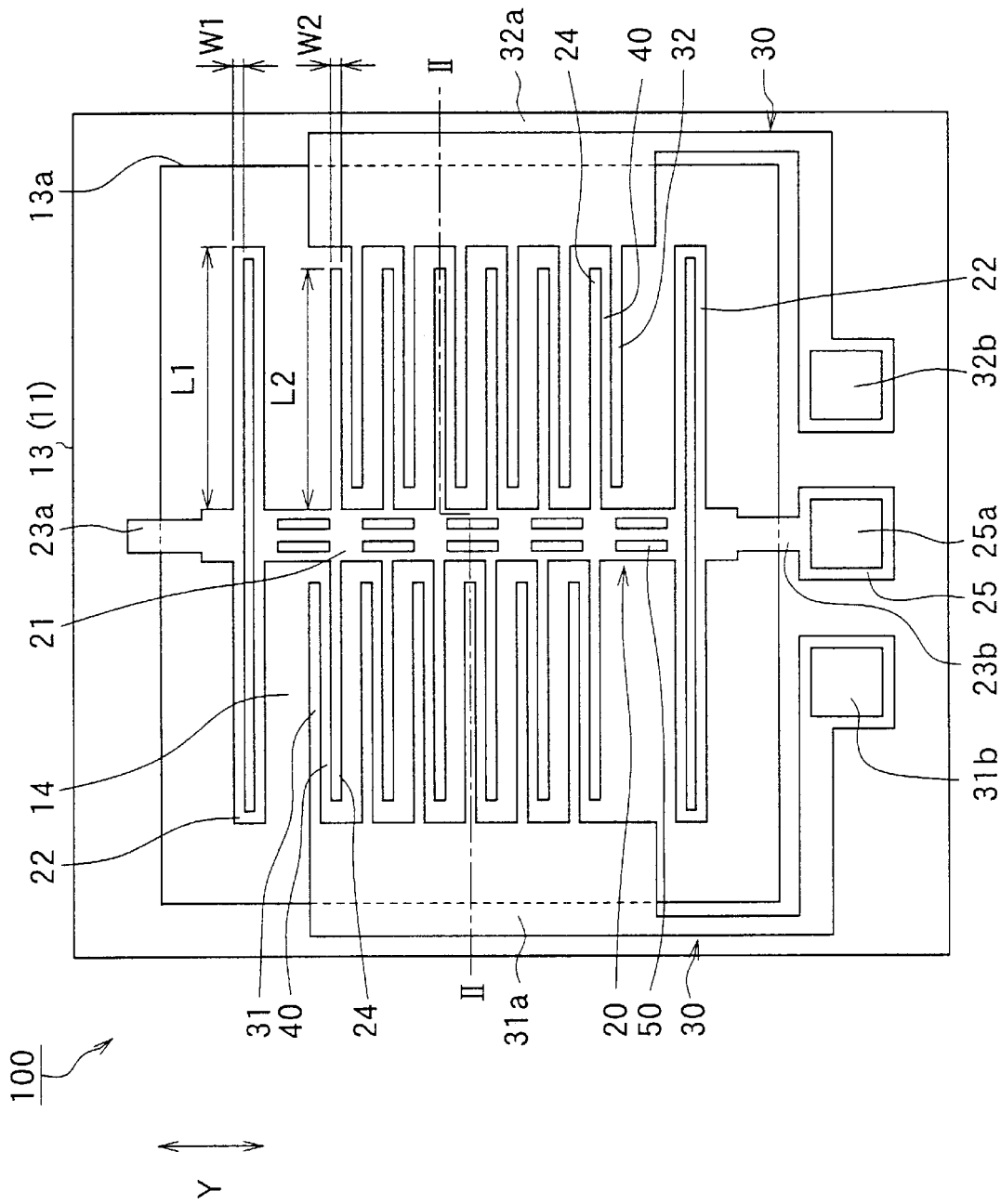
FIG. 1 is a schematic plan view showing a semiconductor acceleration sensor according to an embodiment of the present invention.
Figure 2:
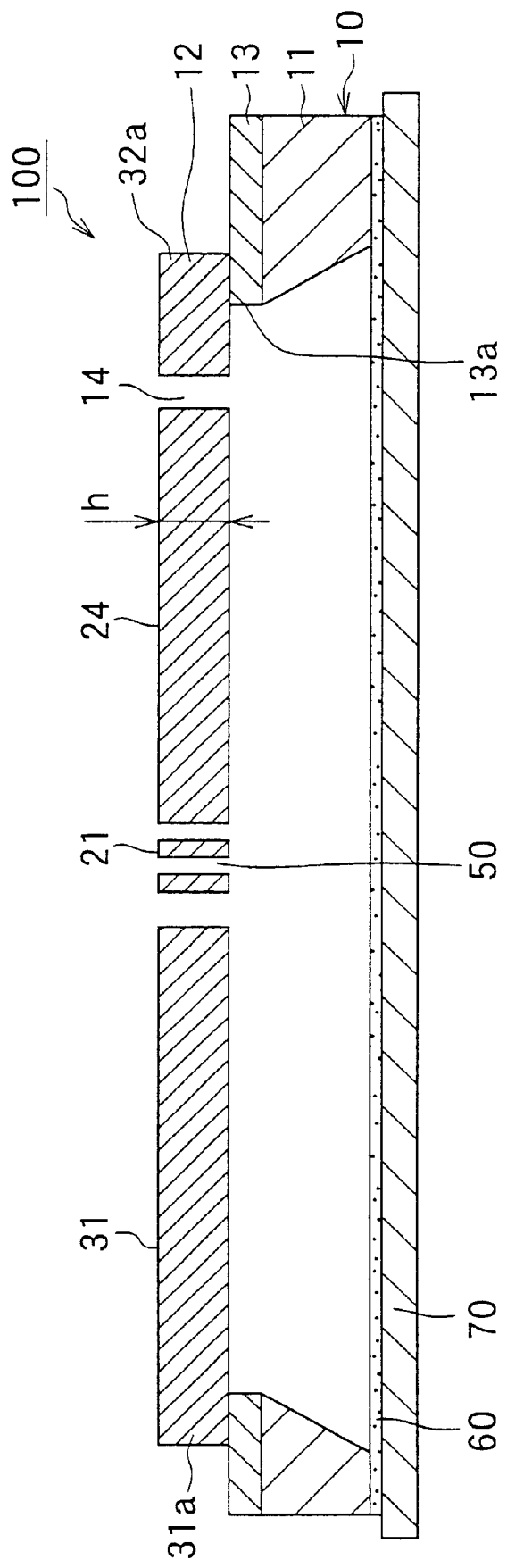
FIG. 2 is a schematic sectional view taken along line II—II in FIG. 1.

A semiconductor acceleration sensor (hereinafter, referred to as "sensor") 100 shown in FIG. 1 is fabricated by a micro-machining process using the well-known semiconductor fabrication process. As shown in FIG. 2, a semiconductor substrate constituting the sensor 100 is a rectangular SOI (silicon on insulator) substrate 10 having a first silicon substrate 11 (base portion), a second silicon substrate 12 and an oxide film 13 as an insulator layer. The oxide film 13 is interposed between the first silicon substrate 11 as a first semiconductor layer and the second silicon substrate 12 as a second semiconductor layer.

Grooves 14 are provided in the second silicon substrate 12 to form beam-structural elements composed of a movable portion 20 and a fixed portion 30 that is separated from the movable portion 20 through the grooves 14. An opening portion 13a is provided with a rectangular shape by sacrificial-layer etching or the like in the oxide film 13 and in the first silicon substrate 11 at an area corresponding to the area where the beam-structural elements 20, 30 are formed. The fixed portion 30 is supported on the first silicon substrate 11 through the oxide film 13 at a peripheral portion of the opening portion 13a.

The movable portion 20, arranged so as to cross over the opening portion 13a, is constructed so that both ends of a rectangular weight portion 21 are integrally connected to anchor portions 23a, 23b through beam portions (spring portions) 22, respectively. The anchor portions 23a, 23b are fixed to the oxide film 13 at the peripheral portions of the opening portion 13a, and are supported by the first silicon substrate 11. Thereby, the weight portion 21 and the beam portions 22 are disposed to face the opening portion 13a.

Each of the beam portions 22 is composed of two beams connected to each other at both ends thereof. Each of the beam portions 22 is a rectangular frame having longer sides perpendicular to direction Y indicated by an arrow Y in FIG. 1, and has a spring function of moving in the direction Y.

Specifically, when acceleration including a component in the direction Y is applied to the beam portion 22, the weight portion 21 is moved in the direction Y by the beam portions 22. Then, the weight portion 21 is returned to its initial position by the beam portions 22 in accordance with disappearance of the acceleration. In this way, the weight portion 21 connected to the beam portions 22 moves together with the beam portions 22 above the opening portion 13a in the direction Y (predetermined direction) in accordance with acceleration applied to the weight portion 21.

The weight portion 21 has plural bar-shaped movable electrodes 24 provided at both sides (right and left sides in FIG. 1) of the weight portion. The movable electrodes 24 extend in the direction perpendicular to the direction Y to form a comb shape at each side. In FIG. 1, six movable electrodes 24 are formed at each side. Each of the movable electrodes 24 has a rectangular cross-section, and faces the opening portion 13a.

The movable electrodes 24, integrated with the weight portion 21, constitute a portion of the movable portion 20, and can move in the direction Y together with the weight portion 21. In this embodiment, as shown in FIG. 1, in the direction parallel to the direction Y, width W2 of each movable electrode 24 is set to be approximately equal to width W1 of each beam portion 22. More specifically, the width W2 is set to fall in a range of ±20% of the width W1 in consideration of processing variation.

The fixed portion 30 has plural bar-shaped fixed electrodes 31, 32 which extend from the first silicon substrate 11 so as to be opposite to the movable electrodes 24 in the direction Y, respectively. Each of the fixed electrodes 31, 32 is cantilevered by the first silicon substrate 11, and is disposed in each of comb intervals of the comb-shaped movable electrodes 24.

The fixed electrodes 31, 32 are composed of first fixed electrodes 31 disposed at the left side in FIG. 1 and second fixed electrodes 32 disposed at the right side in FIG. 1. The first fixed electrodes 31 are electrically independent from the second fixed electrodes 32, and each of the fixed electrodes 31, 32 is formed in a beam shape to have a rectangular cross-section. The first fixed electrodes 31 and the second fixed electrodes 32 are cantilevered by wiring portions 31a, 32a, respectively, to face the opening portion 13a.

Each of the fixed electrodes 31, 32 is disposed so that side surfaces of the fixed electrode 31, 32 are opposite to and parallel to side surfaces of neighboring movable electrodes 24 through predetermined intervals, respectively. Of the intervals between the fixed electrode 31 or 32 and the movable electrodes 24, a narrower interval is a detection interval 40 used for detecting a change in capacitance at the time of detecting acceleration. A wider interval is a non-detection interval that is not used for detecting the change in capacitance at the time of detecting acceleration.

Fixed electrode pads 31b, 32b for wire bonding are formed on the wiring portions 31a, 32a of the fixed electrodes 31, 32 at predetermined positions, respectively. A wiring portion 25 for the movable electrodes 24 is formed to be integrally connected to the anchor portion 23b, and a movable electrode pad 25a for wire bonding is formed on the wiring portion 25 at a predetermined position. The electrode pads 25a, 31b, 32b are made of aluminum, for example.

Plural rectangular through holes 50, which penetrate the weight portion 21 from a side of the opening portion 13a to a side opposite thereto, are provided in the weight portion 21. A rigid-frame structure, composed of plural rectangular frame portions which are combined, is formed by these through holes 50. Thereby, the movable portion 20 is lightened, and torsion strength of the movable portion 20 is enhanced.

In the sensor 100, as shown in FIG. 2, a back surface (surface opposite to the oxide film 13) of the first silicon substrate 11 is bonded to a package 70 through an adhesive 60. In the package 70, a later-described detection circuit 80 is contained. The detection circuit 80 is electrically connected to the electrode pads 25a, 31b, 32b with bonding wires (not shown in the drawings) or the likes made of gold or aluminum.

In this structure, a first capacitance CS1 is provided in the detection intervals 40 between the first fixed electrodes 31 and the movable electrodes 24, and a second capacitance CS2 is provided in the detection intervals 40 between the second fixed electrodes 32 and the movable electrodes 24. The detection circuit 80 detects acceleration based on a change of a differential capacitance (CS1−CS2) by the movable electrodes 24 and the fixed electrodes 31, 32.

Figure 3:
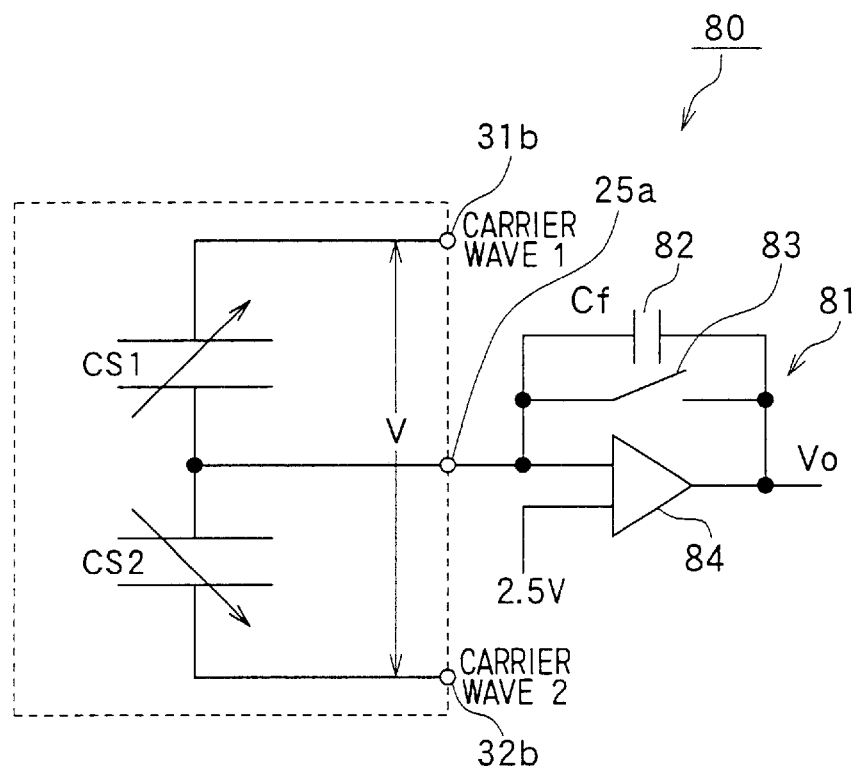
FIG. 3 is a circuit diagram showing a detection circuit of the acceleration sensor shown in FIG. 1.

In the detection circuit 80 shown in FIG. 3, a switched capacitor circuit (SC circuit) 81 for converting the input capacitance difference (CS1−CS2) to a voltage, includes a capacitor 82 having a capacitance Cf, a switch 83 and a differential amplifier circuit 84.

Figure 4:
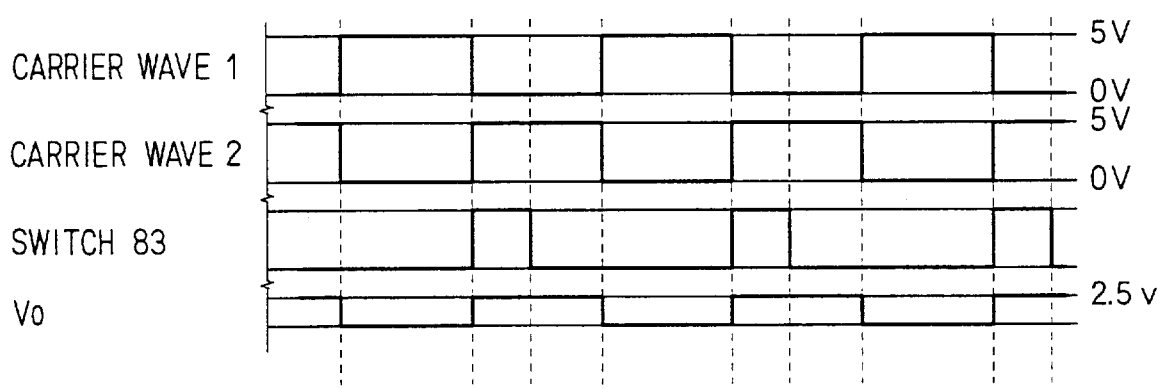
FIG. 4 is a diagram showing an example of a timing chart for the detection circuit shown in FIG. 3.

An example of a timing chart for the detection circuit 80 is shown in FIG. 4. In the sensor 100, a carrier wave 1 (e.g., Frequency: 100 kHz, Amplitude: 0–5 V) is input from the fixed electrode pad 31b, and a carrier wave 2 (e.g., Frequency: 100 kHz, Amplitude: 0–5 V) is input from the fixed electrode pad 32b. Here, the carrier wave 1 is shifted from the carrier wave 2 by 180 degrees in a phase. The switch 83 of the SC circuit 81 is opened/closed according to timings shown in FIG. 4. Then, the acceleration applied to the weight portion 21 is output as a voltage V0 indicated by the following formula (1).

$$V0 = (CS1 - CS2) \cdot V/Cf \quad (1)$$

Here, V indicates a voltage difference between the pads 31b, 32b. As shown in the timing chart, the dynamic quantity sensor normally detects a dynamic quantity in correspondence with the cycle of carrier wave signals changing cyclically.

In this embodiment, the sensor 100 is constructed in the following manner in order to shorten a free vibration time of the movable portion 20 to a degree that does not adversely affect the sensor output. Specifically, in the sensor 100, a Q value of vibration of the movable portion 20 in the direction Y is set to be smaller than 1/500 of a resonance frequency of the movable portion 20 in the direction Y. This Q-value has been obtained as a result of the following studies.

Figure 5:
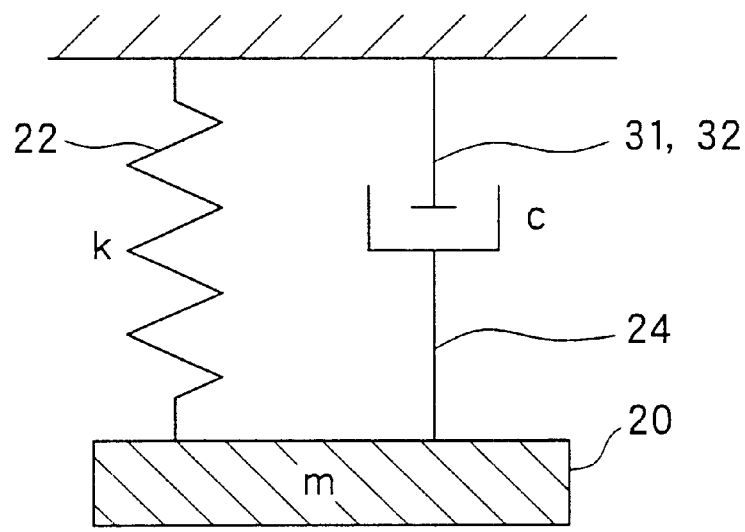
FIG. 5 is a schematic view showing a spring-mass system model of the acceleration sensor shown in FIG. 1.
Figure 6:
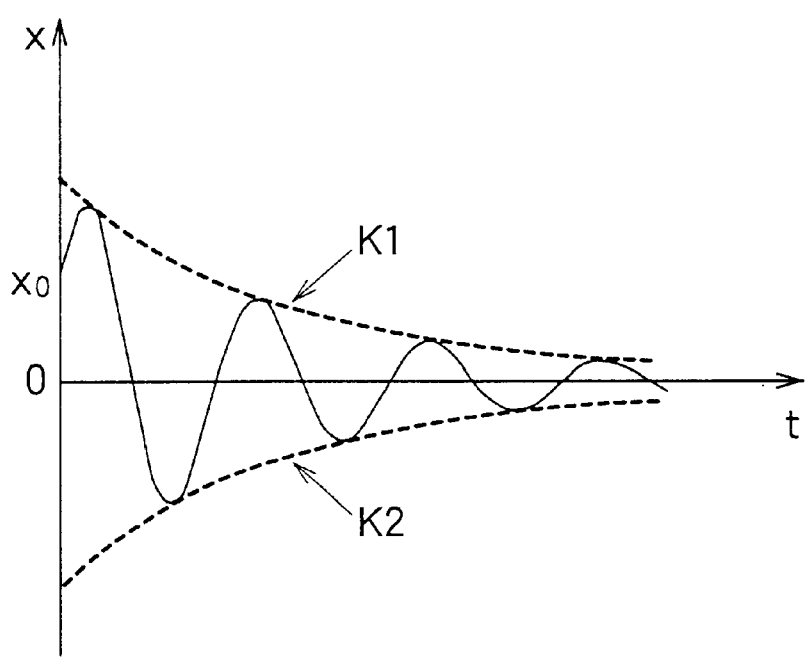
FIG. 6 is a graphical representation showing damping vibration of a movable portion of the acceleration sensor based on the model shown in FIG. 5.

In a spring-mass system model shown in FIG. 5, a mass portion having mass "m" is substituted for the movable portion 20, a spring constant of the beam portion (spring portion) 22 is defined by "k", and a damping coefficient between the movable electrodes 24 and the fixed electrodes 31, 32 is defined by "c". According to this model, the free vibration of the movable portion 20 is damped as shown in FIG. 6. In FIG. 6, "x" represents free-vibration displacement (displacement in the direction Y) of the mass portion, and "t" represents free-vibration time. A damping curve K1 is indicated by the flowing formula (2-1), and a damping curve K2 is indicated by the following formula (2-2).

$$x = B \cdot \exp[(-\pi f/Q) \cdot t] \quad (2\text{-}1)$$

$$x = -B \cdot \exp[(-\pi f/Q) \cdot t] \quad (2\text{-}2)$$

Here, "f" indicates a primary resonance frequency of the movable portion 20, that is, a resonance frequency of the movable portion 20 in the vibration in the direction Y. B is a constant. The primary resonance frequency "f" and the Q value are indicated by the following formulas (3-1), (3-2) using the mass "m" and the spring constant "k".

$$f = (1/2\pi) \cdot (k/m)^{1/2} \quad (3\text{-}1)$$

$$Q = (k \cdot m)^{1/2}/c \quad (3\text{-}2)$$

In the acceleration sensor 100, when high acceleration (shock) is applied to the movable portion 20, it is normally required that the free vibration of the movable portion 20 is damped to be within 1% of the high acceleration for less than 5 milliseconds. A condition satisfying this requirement, which has been obtained by the damping curves K1, K2, is that the Q value of vibration of the movable portion 20 in the direction Y is smaller than 1/500 of the resonance frequency "f" of vibration of the movable portion 20 in the direction Y.

Thus, in the sensor 100, the Q value is set to be smaller than 1/500 of the resonance frequency "f". Therefore, when a large shock is applied to the sensor 100, the free-vibration time of the movable portion 20 can be made shorter so as not to adversely affect sensor output.

According to the formula (3-2), in order to set the Q value as above, it is required to reduce the mass "m" of the movable portion 20, to reduce the spring constant "k" of the beam portion (spring portion) 22, or to increase the damping coefficient "c" between the movable electrodes 24 and the fixed electrodes 31, 32. However, it is difficult to reduce the spring constant "k" because the spring constant depends on a detection range of the sensor 100. Further, because the damping coefficient "c" is related to the capacitance between the movable electrodes 24 and the fixed electrodes 31, 32, it is also difficult to increase the damping coefficient "c". Therefore, the mass "m" of the movable portion 20 is reduced in this embodiment.

Specifically, in the sensor 100, the width W2 of the movable electrode 24 is reduced in order to reduce the mass "m" of the movable portion 20. More specifically as described above, the width W2 of the movable electrode 24 is set to be approximately equal to the width W1 of the beam portion 22 in the direction parallel to the direction Y. As a result, the Q value can be reduced to be less than 1/500 of the resonance frequency of the movable portion 20.

Conventionally, since the width of the movable electrode is wider than the width of the beam portion, the movable electrode is harder than the beam portion. To the contrary, when the width W2 of the movable electrode 24 is reduced to be approximately equal to the width W1 of the beam portion 22 as in this embodiment, there is a possibility that the movable electrode is more flexible than the beam portion 22. In this case, when acceleration is applied to the sensor 100, the movable electrode 24 moves, before the weight portion 21 moves by the beam portion 22, to change the detection intervals 40, resulting in sensor-output errors.

This problem has been also studied, and the following structure is adopted in this embodiment. That is, as shown in FIG. 1, when the length of the rectangular frame-shaped beam portion 22 is represented as L1 and the length of the bar-shaped movable electrode 24 is represented as L2, preferably, the length L2 of the movable electrode 24 is shorter than $(n/3)^{1/3} \cdot L1$. Here, "n" is the number of the movable electrodes 24.

This relationship between the length L1 and the length L2 has been led out as follows. Specifically, a resonance frequency f1 of the beam portion 22 and a resonance frequency f2 of the movable electrode 24 are indicated by the following formulas (4), (5), respectively.

$$f1 = \sqrt{\frac{(2 \times h \times b^3 \times E)/L1^3}{L2 \times 2 \times n \times b \times h \times \rho}} \times \frac{1}{2\pi} \quad (4)$$

$$f2 = \frac{\pi^2}{L2^2} \times \sqrt{\frac{E \times h \times b^3/12}{b \times h \times \rho}} \times \frac{0.356}{2\pi} \quad (5)$$

Here, "b" is the width W1, W2 of the beam portion 22 and the movable electrode 24, "h" is a thickness of the beam portion 22 and the movable electrode 24 (thickness of the second silicon substrate 12), E is Young's modulus of silicon (Si), and $\rho$ is the density of the movable electrode 24 and the beam portion 22.

In order to set the movable electrode 24 harder than the beam portion 22, the resonance frequency f1 of the beam portion 22 is required to be smaller than the resonance frequency f2 of the movable electrode 24 (i.e., f1<f2). Then, a relationship indicated by in the following formula (6) is obtained from the relationship (f1<f2) and the above formulas (4), (5).

$$L2 < (n/3)^{1/3} \cdot L1 \quad (6)$$

The length L2 of the movable electrode 24 and the length L1 of the beam portion 22 are set to satisfy the formula (6), so that the movable electrode 24 is made harder than the beam portion 22, thereby ensuring sensor output accuracy.

According to this embodiment, in the movable portion 20, the relationship between the Q value and the resonance frequency is predetermined in the above-described manner. Therefore, even when a large shock is applied to the sensor 100, the free vibration of the movable portion 20 can be rapidly damped, thereby providing an acceleration sensor having stable output with respect to large acceleration.

In the above embodiment, each number of the movable electrodes and the fixed electrode can be one, and the spring portion can be also have another structure other than that of the above-described beam portion 22. The present invention can be applied to various dynamic quantity sensors such as an angular velocity sensor and a pressure sensor, in addition to the acceleration sensor as described above.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A dynamic quantity sensor comprising:

a base portion;

a spring portion for moving in a predetermined direction in accordance with a dynamic quantity applied thereto, the spring portion being connected to the base portion;

a movable portion connected to the spring portion for moving together with the spring portion in the predetermined direction;

a movable electrode integrated with the movable portion for moving together with the movable portion; and a fixed electrode supported by the base portion and arranged opposite to the movable electrode while defining a detection interval, a change of which caused by displacement of the movable electrode is detected to detect the dynamic quantity, wherein:

a Q value of vibration of the movable portion in the predetermined direction is smaller than 1/500 of a resonance frequency of the vibration of the movable portion in the predetermined direction.

2. The dynamic quantity sensor according to claim 1, wherein:

the spring portion is a beam portion having a rectangular frame shape including a longer side perpendicular to the predetermined direction;

each of the movable electrode and the fixed electrode has a bar shape extending in a direction perpendicular to the predetermined direction; and a side surface of the movable electrode and a side surface of the fixed electrode are opposite to each other with the detection interval therebetween.

3. The dynamic quantity sensor according to claim 1, wherein a width of the movable electrode is approximately equal to a width of the spring portion in a direction parallel to a predetermined direction.

4. The dynamic quantity sensor according to claim 3, wherein the width of the movable electrode falls in a range of ±20% of the width of the spring portion.

5. The dynamic quantity sensor according to claim 3, wherein:

the movable electrode is composed of a plurality of movable electrode members; and the plurality of movable electrode members and the spring portion satisfy a relationship of:

$$L2<(n/3)^{1/3} \cdot L1,$$

wherein L1 is a length of the beam portion, L2 is a length of each of the plurality of movable electrode members, and n is a number of the plurality of movable electrode members.

6. A dynamic quantity sensor comprising:

a base portion;

a spring portion for moving in a predetermined direction in accordance with a dynamic quantity applied thereto, the spring portion being provided above the base portion;

a movable portion connected to the spring portion for moving together with the spring portion in the predetermined direction;

a movable electrode integrated with the movable portion for moving together with the movable portion; and a fixed electrode supported by the base portion and arranged opposite to the movable electrode while defining a detection interval, a change of which caused by displacement of the movable electrode is detected to detect the dynamic quantity, wherein:

a Q value of vibration of the movable portion in the predetermined direction is smaller than 1/500 of a resonance frequency of the vibration of the movable portion in the predetermined direction.

7. The dynamic quantity sensor according to claim 6, wherein:

a resonance frequency of the spring portion is less than a resonance frequency of the movable electrode to thereby ensure sensor output accuracy.

8. The dynamic quantity sensor according to claim 6, wherein:

the spring portion is comprised of a beam portion having a rectangular frame shape; and a width of the movable electrode is approximately equal to a width of the beam portion.

* * * * *